(12) United States Patent
Watanabe et al.

(10) Patent No.: US 8,803,411 B2
(45) Date of Patent: Aug. 12, 2014

(54) CHARGED PARTICLE BEAM RADIATION APPARATUS

(75) Inventors: Shunichi Watanabe, Hitachinaka (JP); Takashi Onishi, Mito (JP); Minoru Kaneda, Hitachinaka (JP); Hisaya Murakoshi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 6 days.

(21) Appl. No.: 13/812,700

(22) PCT Filed: Jun. 15, 2011

(86) PCT No.: PCT/JP2011/003394
§ 371 (c)(1),
(2), (4) Date: Feb. 8, 2013

(87) PCT Pub. No.: WO2012/014370
PCT Pub. Date: Feb. 2, 2012

(65) Prior Publication Data
US 2013/0140977 A1    Jun. 6, 2013

(30) Foreign Application Priority Data

Jul. 29, 2010    (JP) ................................. 2010-169967

(51) Int. Cl.
| | |
|---|---|
| *H01J 29/84* | (2006.01) |
| *H01J 29/48* | (2006.01) |
| *H01J 3/40* | (2006.01) |
| *H01J 3/02* | (2006.01) |
| *H01J 37/02* | (2006.01) |

(52) U.S. Cl.
CPC ................. *H01J 29/484* (2013.01); *H01J 3/40* (2013.01); *H01J 3/02* (2013.01); *H01J 37/026* (2013.01)
USPC ............................. 313/458; 313/441; 313/446

(58) Field of Classification Search
CPC ......... H01J 37/06; H01J 37/07; H01J 37/026; H01J 37/16; H01J 37/073; H01J 29/484; H01J 29/84; H01J 29/88; H01J 33/00; H01J 3/40; H01J 3/026; H01J 3/027; H01J 3/02; H01J 2237/0203–2237/0213; H01J 2237/20; H01J 2237/303
USPC ..................... 313/364–477 HC, 259.1–363.1; 250/396 R–400
See application file for complete search history.

(56) References Cited

U.S. PATENT DOCUMENTS 3,631,282 A * 12/1971 Herb .......................... 313/359.1

(Continued)

FOREIGN PATENT DOCUMENTS

| JP | 08-222160 A | 8/1996 |
|---|---|---|
| JP | 2009-193896 A | 8/2009 |
| JP | 2010-015818 A | 1/2010 |

*Primary Examiner* — Mariceli Santiago
(74) *Attorney, Agent, or Firm* — Mattingly & Malur, PC

(57) ABSTRACT

In an accelerating tube which uses a conductive insulator, there is a possibility that the dopant concentration on a surface of the conductive insulator becomes non-uniform so that the surface resistance of the conductive insulator becomes non-uniform. Accordingly, a circumferential groove is formed on the inner surface of the conductive insulator accelerating tube in plural stages, and metal is metalized along inner portions of the grooves. When the resistance of a specific portion on the surface of the accelerating tube differs from the resistance of an area around the specific portion, the potential of the metalized region on the inner surface of the accelerating tube becomes a fixed value and hence, the potential distribution on the inner surface of the accelerating tube in the vertical direction can be maintained substantially equal without regard to the circumferential direction.

4 Claims, 9 Drawing Sheets

1···FE ELECTRON SOURCE  2···ACCELERATING TUBE  3···EXTRACTING ELECTRODE
4···ELECTRON BEAM  5···CONTROL ELECTRODE  6···INSULATING-MATERIAL INSULATOR
7···CONDUCTIVE INSULATOR  8···METAL-METALIZED PORTION

(56) References Cited

U.S. PATENT DOCUMENTS 4,764,674 A * 8/1988 Kinoshita .................... 250/310

2003/0155521 A1 * 8/2003 Feuerbaum ............... 250/396 R
2009/0224701 A1 9/2009 Morita et al.

* cited by examiner

1··· FE ELECTRON SOURCE  2··· ACCELERATING TUBE  3··· EXTRACTING ELECTRODE
4··· ELECTRON BEAM  5··· CONTROL ELECTRODE  6··· INSULATING-MATERIAL INSULATOR
7··· CONDUCTIVE INSULATOR  8··· METAL-METALIZED PORTION

9 ··· CONDUCTOR METAL   10 ··· ACCELERATING ELECTRODE   11 ··· BLEEDER RESISTOR

12··· PORTION WITH LARGE RESISTANCE

CHARGED PARTICLE BEAM RADIATION APPARATUS

TECHNICAL FIELD

The present invention relates to the structure of an electron gun or an ion gun of a charged particle beam apparatus.

BACKGROUND ART

In an electron gun or an ion gun of a charged particle beam apparatus such as an electron microscope or a focused ion beam processing apparatus, particularly in an electron gun (or an ion gun) which generates a charged particle beam having high acceleration energy, an electron gun (or an ion gun) having the accelerating tube structure has been popularly used for applying a high voltage in a stable manner.

FIG. 2 is a schematic view of an electron gun having the accelerating tube structure. Assume an FE electron gun which uses an accelerating tube of six stages shown in the drawing. In the drawing, reference numeral 1 indicates an FE electron source whose distal end is sharpened to a radius of approximately several 100 nm, and reference numeral 2 indicates an extracting electrode. The accelerating tube 2 is formed by alternately stacking an insulating-material insulator 6 made of glass or ceramic and a conductor metal 9. An electrode is mounted on the respective conductive metals 9. The electrode arranged below the extracting electrode particularly constitutes a control electrode 5, and other electrodes constitute accelerating electrodes 10. A bleeder resistor 11 of several GΩ is mounted between the respective electrodes of the accelerating tube.

In operating the electron gun, a negative potential of several 100 kV is applied to the FE electron source 1. This voltage is particularly referred to as an accelerating voltage (V0). A positive extracting voltage (V1) of several kV is applied to the extracting electrode 3 relative to the FE electron source 1. An intense electric field is generated on the distal end of the FE electron source 1 by the extracting voltage (V1) so that an electron beam 4 is discharged from the distal end by a tunneling effect. A trajectory of the discharged electron beam 4 is controlled by the control electrode 5, and the discharged electron beam 4 is accelerated to energy of the accelerating voltage (V0) applied to the electron source while passing through the accelerating tube. Assuming the accelerating voltage as V0 and the control electrode as V2, a voltage between the control electrode and a ground voltage is expressed as V0-V2. When the bleeder resistors 11 between the respective stages have the same resistance, each inter-stage voltage becomes equal to (V0-V2)/5. Accordingly, a change in potential gradient in the accelerating tube becomes small. As a result, with the provision of the accelerating tube structure, an electron beam can be accelerated while suppressing the influence of an electrostatic lens effect at a low level.

As described above, the conventional accelerating tube uses the insulating-material insulator 6 made of glass or ceramic. When reflected electrons, scattered electrons or the like impinge on the insulating material, there exists a possibility that a charge is accumulated (a charge is increased) on a surface of the insulating material. When the charge on the surface of the insulating-material insulator 6 is increased, the potential distribution in the accelerating tube is changed so that a trajectory of the electron beam 4 is changed thus giving rise to a phenomenon that the electron beam flickers when the electron beam is observed. To prevent such a charge-up phenomenon, the conventional accelerating tube 2 has the structure where the accelerating electrode 10 has a complicated shape for avoiding the direct contact of reflected electrons and scattered electrons of the electron beam 4 with the insulating-material insulator 6. Such an accelerating electrode 10 makes the manufacture thereof complicated, and when the accelerating electrode 10 is assembled into the accelerating tube 2, a potential gradient on a center axis becomes unfixed strictly speaking so that the aberration of the electron beam 4 is also increased.

Recently, there has been reported a technique on a conductive insulator where the resistance of a surface of insulating ceramic is slightly lowered by injecting (doping) a foreign material (dopant) such as titanium carbide into the surface of the insulating ceramic. FIG. 3 shows one example of an electron gun where such a conductive insulator is used between a second stage and a sixth stage of the accelerating tube. A conductive insulator 7 used in the accelerating tube 2 is particularly characterized in that the resistance on an inner surface is made small. A specific resistance value falls within a range of several 100MΩ to several 10GΩ. With the use of the conductive insulator 7, a charge which is generated when the electron beam 4 impinges on the surface of the insulator flows as an electric current on the surface of the conductive insulator and hence, the charge is not increased. Accordingly, a shape of the accelerating electrode 10 on each stage can have the simple structure different from conventional electron guns. Further, by setting the resistance of the conductive insulator 7 used on each stage equal to a value of the conventional bleeder resistance, it is also possible to provide an electron gun where the bleeder resistance is eliminated.

In the accelerating tubes shown in FIG. 2 and FIG. 3, a voltage is divided corresponding to respective stages such that a potential gradient becomes as uniform as possible. However, with the use of the conductive insulator 7, even when the second stage and stages succeeding the second stage are collected into one stage and all accelerating electrodes 10 below the control electrode 5 are removed, a charge is not increased whereby the potential gradient at or below the control electrode 5 can be made uniform. FIG. 4 shows the schematic constitution of an accelerating tube having no electrodes at the position of the control electrode 5 or below. The accelerating tube of this electron gun is formed into an integral body and hence, high coaxiality can be maintained. Further, the accelerating tube can maintain a large diameter and hence, the gradient of the potential distribution in the vertical direction can be maintained uniformly. Accordingly, an electron beam 4 whose trajectory is controlled by the control electrode 5 straightly passes through the inside of the accelerating tube, and is discharged from the electron gun. As a result, the electron gun shown in FIG. 4 can simplify the internal structure thereof, and the aberration of the electron beam 4 can be made also small.

Further, FIG. 5 is an electron gun where a control electrode 5 is eliminated so that the whole accelerating tube 2 is formed of a conductive insulator 7. In this case, although a trajectory of an electron beam 4 extracted from an FE electron source 1 cannot be controlled, the electron beam 4 is accelerated straightly and is discharged from the electron gun and hence, the aberration is made smaller. Further, it is also possible to eliminate a control power source which supplies a control voltage (V2).

CITATION LIST

Patent Literature

PTL 1: JP-A-2009-193896 (US Laid-Open Publication 2009/0224701)

SUMMARY OF INVENTION

Technical Problem

As described above, the conductive insulator 7 is manufactured by injecting (doping) several % of impurity (dopant)

such as titanium carbide into a surface of a ceramic insulator made of alumina or the like. However, in actually manufacturing the conductive insulator 7, it is difficult to uniformly inject the dopant into the surface of the ceramic insulator. When the dopant is not uniformly injected into the surface of the ceramic insulator, the concentration of the dopant becomes non-uniform so that the resistance of an inner surface of the accelerating tube becomes non-uniform. For example, assume an accelerating tube 2 which uses a conductive insulator 7 as shown in FIG. 6(a). It is assumed that a position in the inside of the accelerating tube is expressed by a circular columnar coordinate system where a center axis Z (in general, aligned with an optical axis of an electron beam) of the accelerating tube is set as a Z axis, and an R axis in the drawing is set as a reference axis in the radius vector direction. It is also assumed that a potential of −200 kV is applied to an upper portion (Z=0) of the accelerating tube, and a potential of 0V is applied to a lower portion (Z=L) of the accelerating tube. Here, it is assumed that the resistance of only a portion 12 of an inner wall surface of the accelerating tube 2 in the vicinity of a position where Z=Za, θ=θa is higher than the resistances of other portions of the inner wall surface. In this case, the potential distribution on the inner surface of the accelerating tube in the vertical (Z) direction differs corresponding to an inner peripheral position (expressed by an angle θ) of the accelerating tube. For example, the potential distribution at θ=0 on the R axis becomes, as expressed in FIG. 6(b), the potential distribution where the potential smoothly changes from −200V at Z=0 to 0V at Z=Za. That is, a potential gradient having the fixed inclination is formed. On the other hand, the potential distribution at a position where θ=θa including the region 12 is expressed in FIG. 6(c), and a potential gradient which discontinuously changes at the portion 12 where the resistance becomes large (the potential gradient being increased in this case) is formed. This state is substantially equal to a state where a potential in the circumferential direction (θ direction) is not fixed at the same height (Z). As a result, an electric field in the lateral direction is generated on the center axis of the accelerating tube so that an electron beam 4 is bent by receiving a force in the lateral direction thus causing aberration or flickering.

Further, when there exists a portion which is not injected with a dopant at all even at one place in the inside of the accelerating tube, a charge is accumulated in such a portion thus giving rise to a possibility that the potential distribution becomes non-uniform and a discharge is performed.

Accordingly, the problem that the present invention is to solve is that, in an accelerating tube which uses a conductive insulator, when the concentration of a dopant on a surface becomes non-uniform, the potential distribution on an inner surface of the accelerating tube in the vertical direction does not become uniform depending on the circumferential direction.

Solution to Problem

A conductive insulator is characterized in that metal can be metalized on a specific portion of a surface of the conductive insulator. The present invention can overcome the above-mentioned task by forming a circumferential metalized region on an inner wall surface of a conductive insulator accelerating tube. It is preferable to form such a metalized region in plural places of the accelerating tube in the longitudinal direction of the accelerating tube.

Advantageous Effects of Invention

A potential of the metalized region can be maintained at the same level and hence, even when a conductive insulator whose dopant concentration on an inner surface of an accelerating tube is non-uniform is used, the relatively uniform potential distribution can be acquired. Further, the accelerating tube of the present invention can be formed as an integral body and hence, the accelerating tube can acquire high coaxiality.

DESCRIPTION OF EMBODIMENTS

The present invention provides an electron gun with small aberration where, in an accelerating tube which uses a conductive insulator, a metalized region is formed so as to keep the relatively uniform potential distribution and a potential gradient on a center axis is maintained at a constant level as much as possible.

Figure 1:
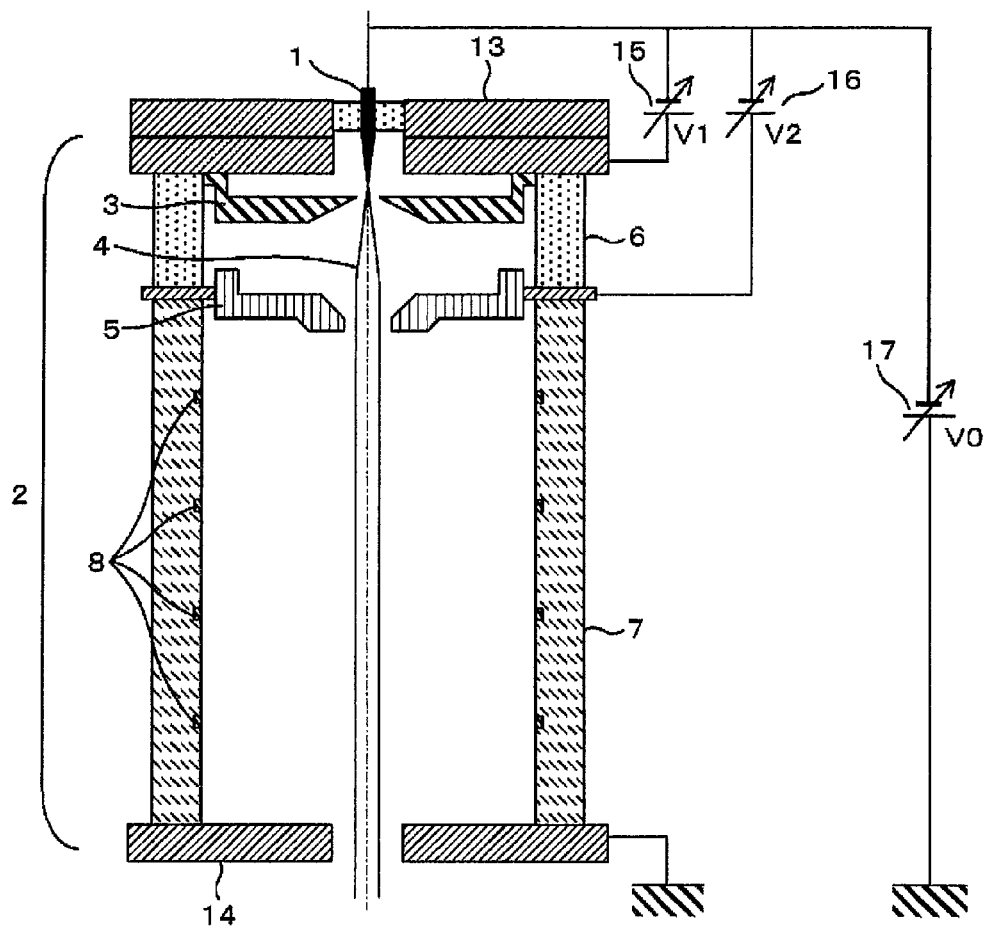
[FIG. 1]
An explanatory view showing an embodiment of an electron gun of the present invention which uses a conductive insulator (embodiment 1).

FIG. 1 is a schematic view showing a cross section of an electron gun of this embodiment which uses an accelerating tube. In this embodiment, an FE electron gun having an accelerating voltage of 100 to 300 kV is assumed. An FE electron source 1 is mounted on an upper portion of an accelerating tube 2, and an accelerating voltage (V0) is applied to the FE electron source 1. A metal member 13 is arranged around a distal end (emitter chip) of the FE electron source 1 such that the metal member 13 surrounds the chip. A circular columnar insulating-material insulator 6 is arranged below the metal member 13, and an extracting electrode 3 is arranged in the inside of a closed space formed by the metal member 13 and the insulating-material insulator 6. A predetermined potential (approximately several kV) is supplied to the extracting electrode 3 from an external voltage source 15 through the metal member 13, and the potential difference between a supplied potential and a potential applied to the FE electron source 1 forms an extracting voltage (V1). An intense electric field is generated in the emitter chip of the FE electron source 1 by the extracting voltage, and an electron beam 4 is discharged by a tunneling effect. For this end, an opening portion which allows the electron beam 4 to pass therethrough is formed in the extracting electrode 3. The electron beam 4 is usually discharged toward a lower side by taking a trajectory which slightly expands from an optical axis of the electron beam indicated by a dotted line.

A circular columnar conductive insulator 7 which is fixedly mounted on a metal member 14 is arranged below the insulating-material insulator 6, and a control electrode 5 is arranged on an inner wall surface side of a connecting portion between the insulating-material insulator 6 and the conductive insulator 7. A control voltage (V2) of several kV to several 10 kV is applied to the control electrode 5 from an external voltage source 16 relative to the FE electron source. The control voltage (V2) is used for controlling the trajectory of the extracted electron beam 4. The extracting electrode 3 and the metal member 13 are insulated from the control electrode 5 by the insulating-material insulator 6 so that the potential difference is maintained. The insulating-material insulator 6 is made of alumina ceramic or the like, for example.

Figure 2:
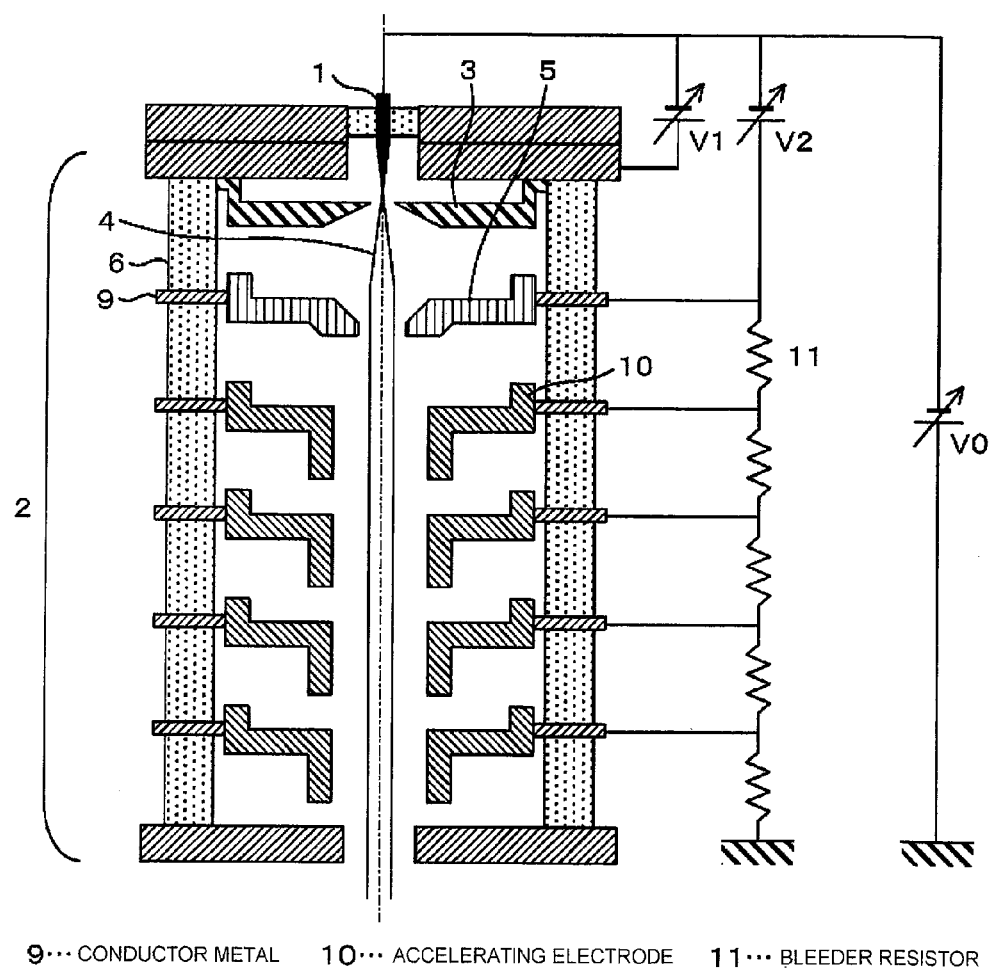
[FIG. 2]
An explanatory view showing the schematic constitution of a conventional electron gun which uses an insulation-material insulator (conventional example 1).
Figure 3:
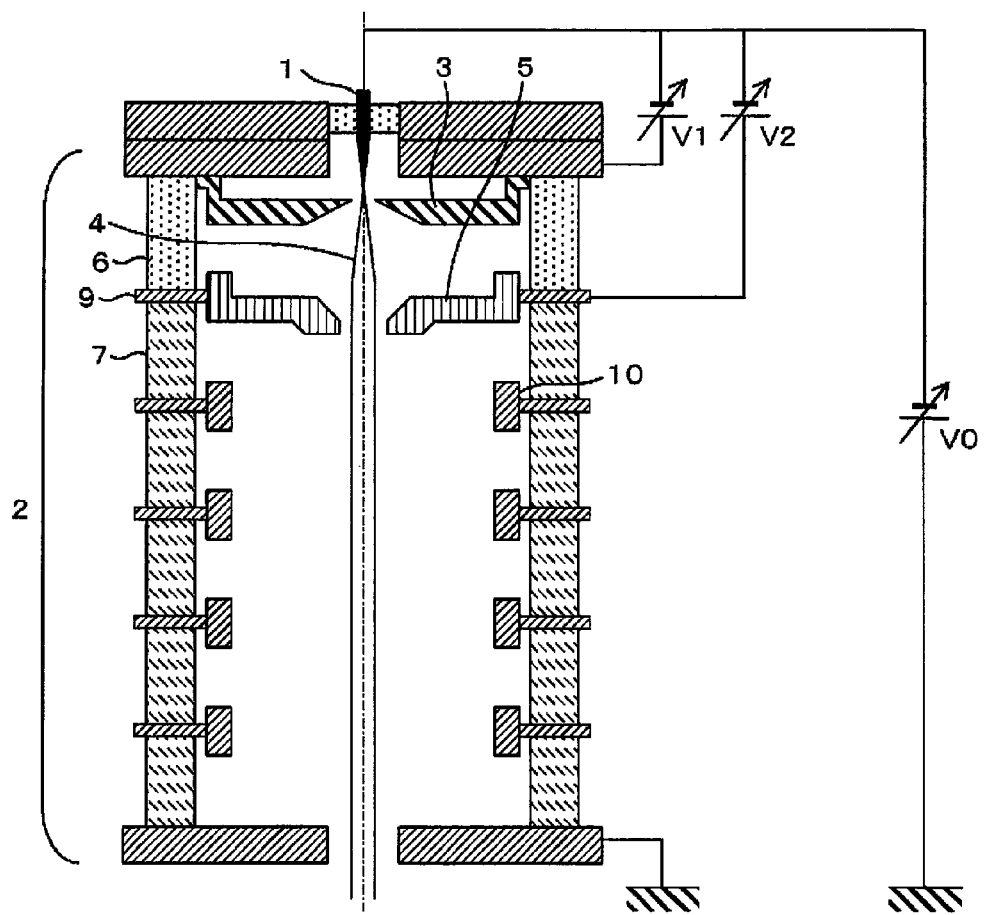
[FIG. 3.]
An explanatory view showing the schematic constitution of a conventional electron gun which uses a conductive insulator (conventional example 2).
Figure 4:
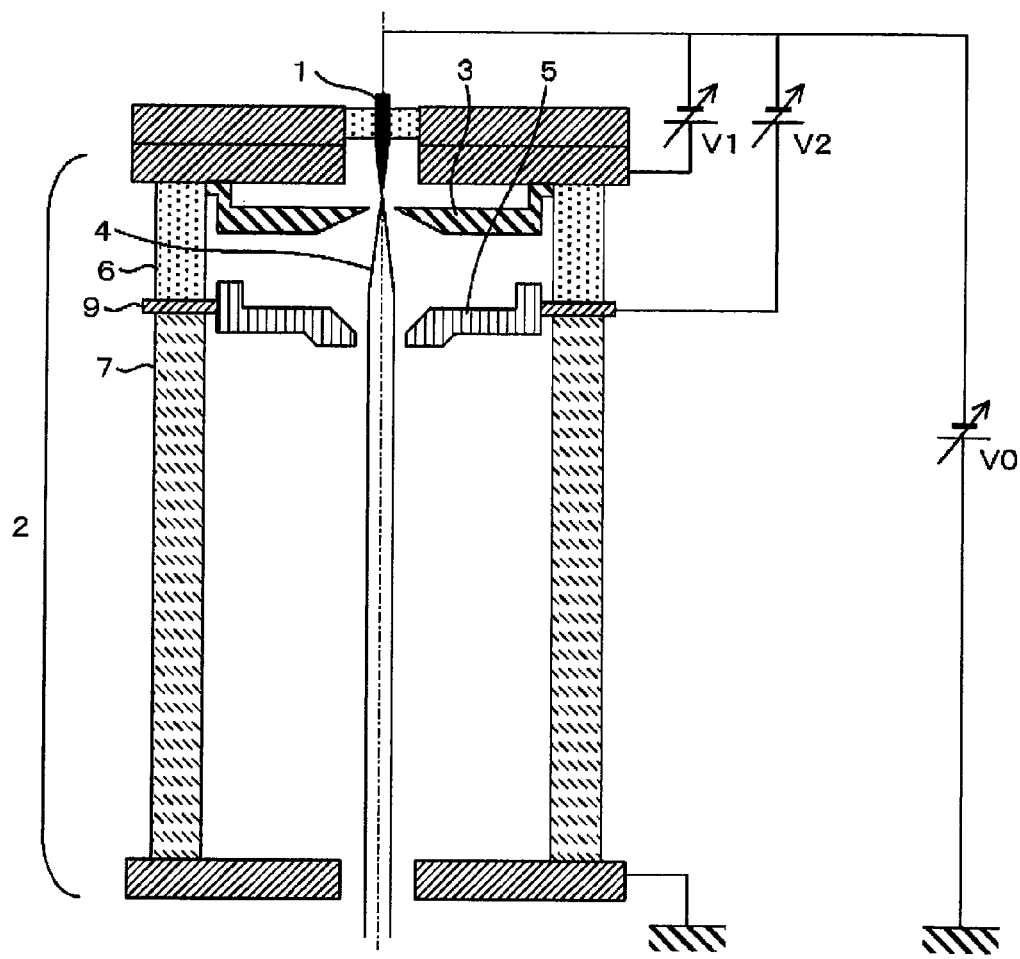
[FIG. 4]
An explanatory view showing the schematic constitution of another conventional electron gun which uses a conductive insulator (conventional example 3).
Figure 5:
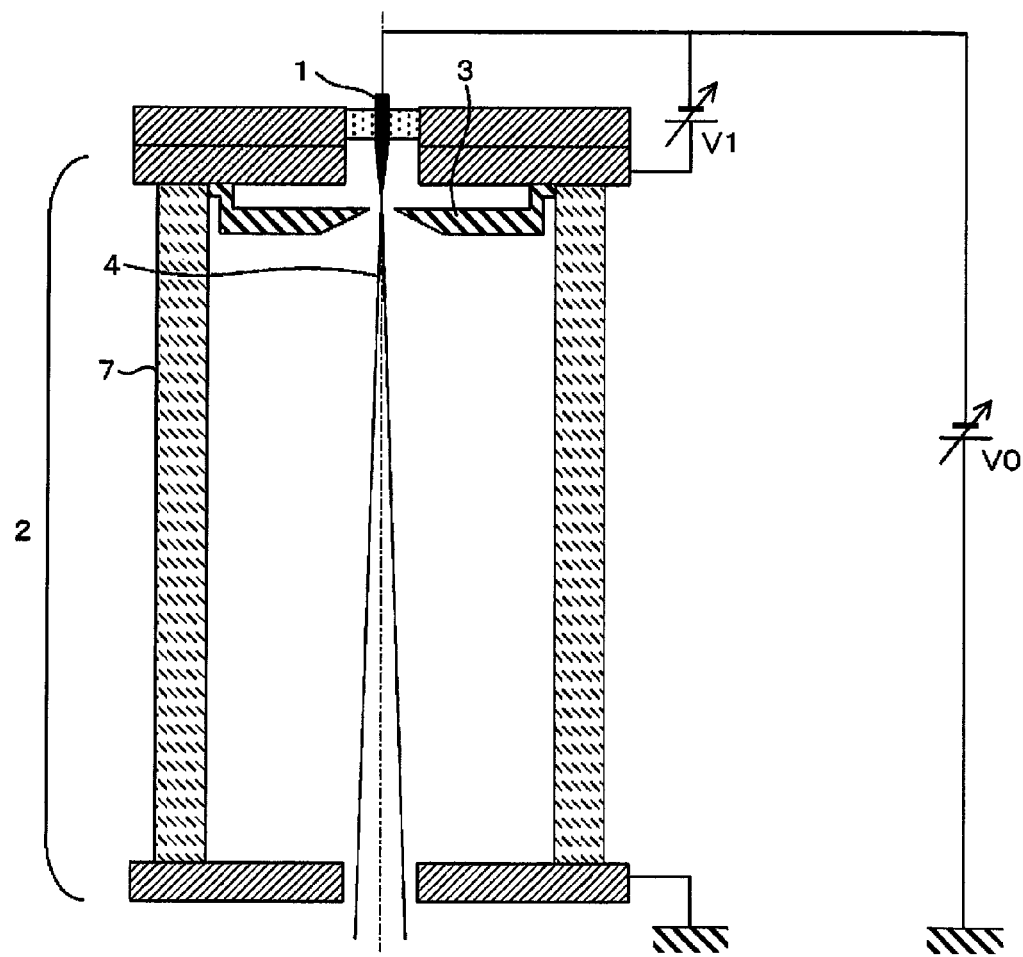
[FIG. 5]
An explanatory view showing the schematic constitution of another conventional electron gun which uses a conductive insulator (conventional example 4).
Figure 7:
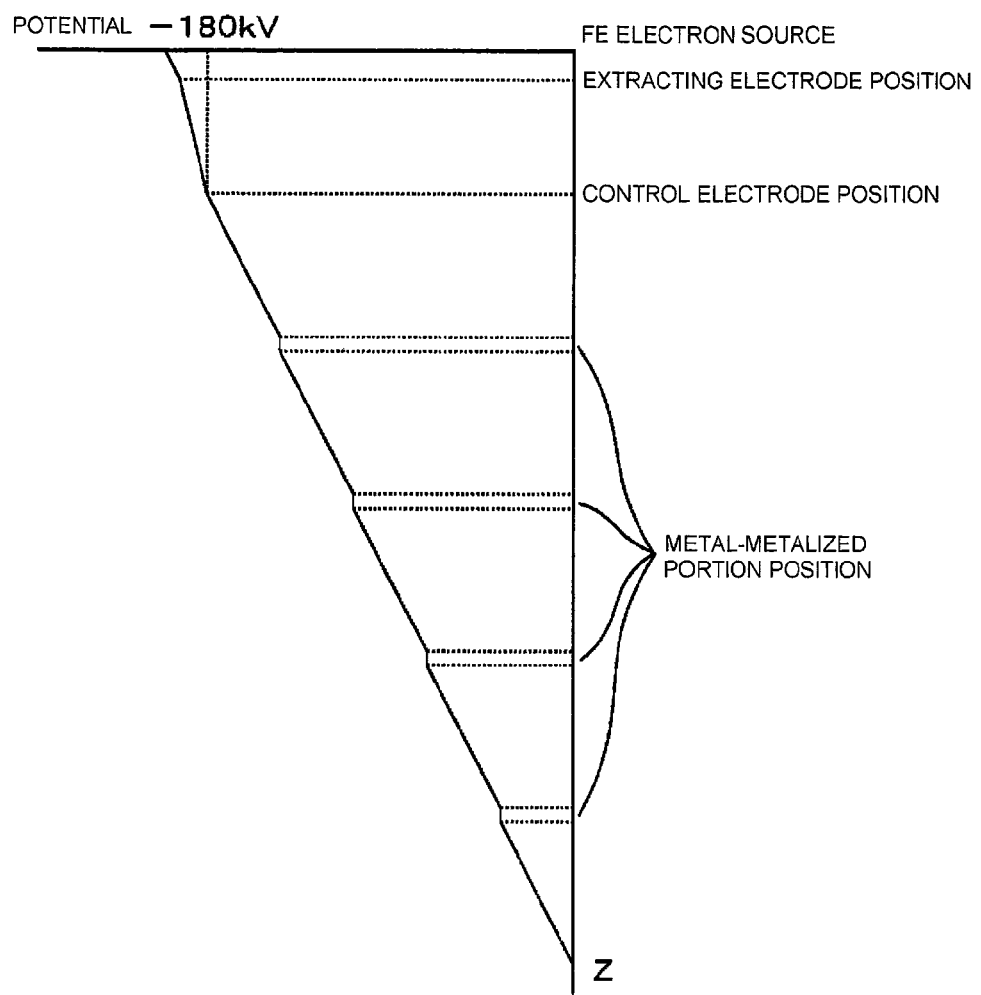
[FIG. 7]
An explanatory view showing a potential distribution characteristic of the electron gun of the present invention which uses the conductive insulator.

In the electron gun of this embodiment, the conductive insulator 7 is used for forming the accelerating tube below the control electrode 5. A groove having a width of approximately 1mm, for example, is formed on an inner wall surface of the conductive insulator 7 at plural stages, and metal is metalized along inner portions of the grooves. Metalizing means processing where a metal layer is formed on a surface of an insulating material (mainly ceramic) by a method such as thermal spraying or baking, and a region where electric conductivity is higher than electric conductivity of the conductive insulator can be formed by metalizing. For example, when four grooves are formed in the conductive insulator 7 for dividing the conductive insulator 7 into five stages in the longitudinal direction, the potential distribution in the accelerating tube takes an approximately fixed potential gradient as shown in FIG. 7. In FIG. 7, it is assumed that the accelerating voltage (V0) is −200 kV, and the control voltage (V2) is 20 kV. Here, it is calculated that voltages between the respective stages become the same voltage of 36 kV. Although the potential gradient below the control electrode 5 becomes gentle in metal-metalized regions, the potential gradient becomes substantially fixed when the accelerating tube is viewed as a whole. Accordingly, the electron beam 4 which passes through the control electrode 5 is accelerated while taking an approximately straight trajectory, and the electron beam 4 is discharged from the electron gun. Here, the aberration generated in the accelerating tube 2 becomes small. Further, the accelerating tube has no electrodes except for the metalized regions and hence, the potential gradient on a center axis of the accelerating tube can be maintained at a substantially fixed level. Accordingly, the electric field distribution in the circumferential direction in the accelerating tube becomes uniform compared to the electron guns having the conventional shapes shown in FIG. 2 and FIG. 3 so that the aberration in the electron gun of this embodiment becomes smaller than the aberration in the conventional electron guns.

Figure 6:
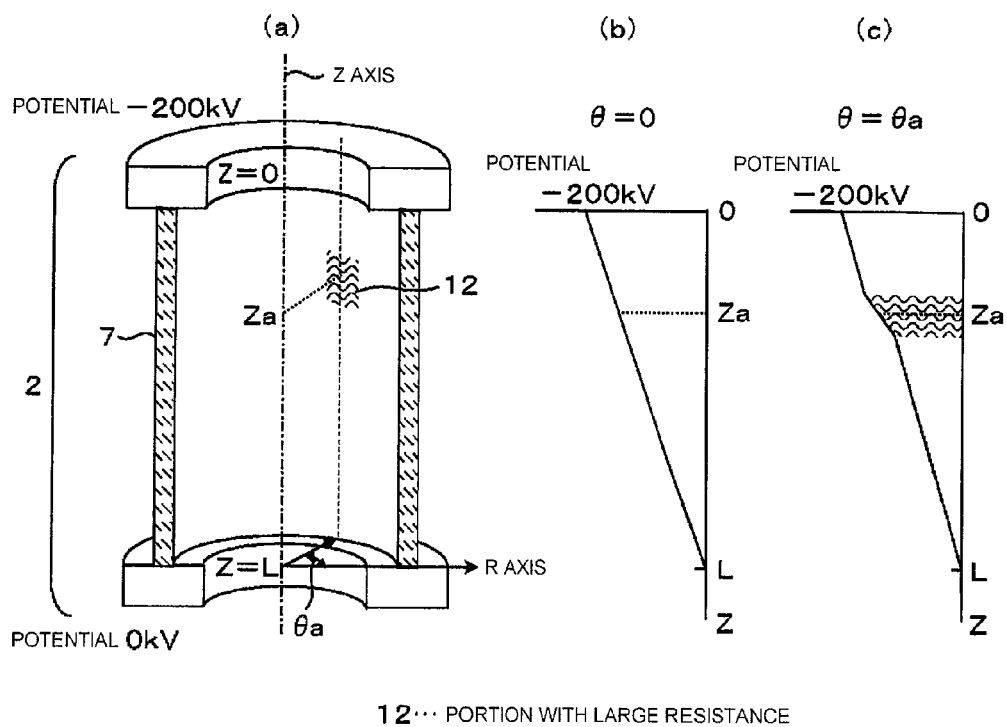
[FIG. 6]
An explanatory view showing a problem that the conventional electron gun which uses the conductive insulator has.
Figure 9:
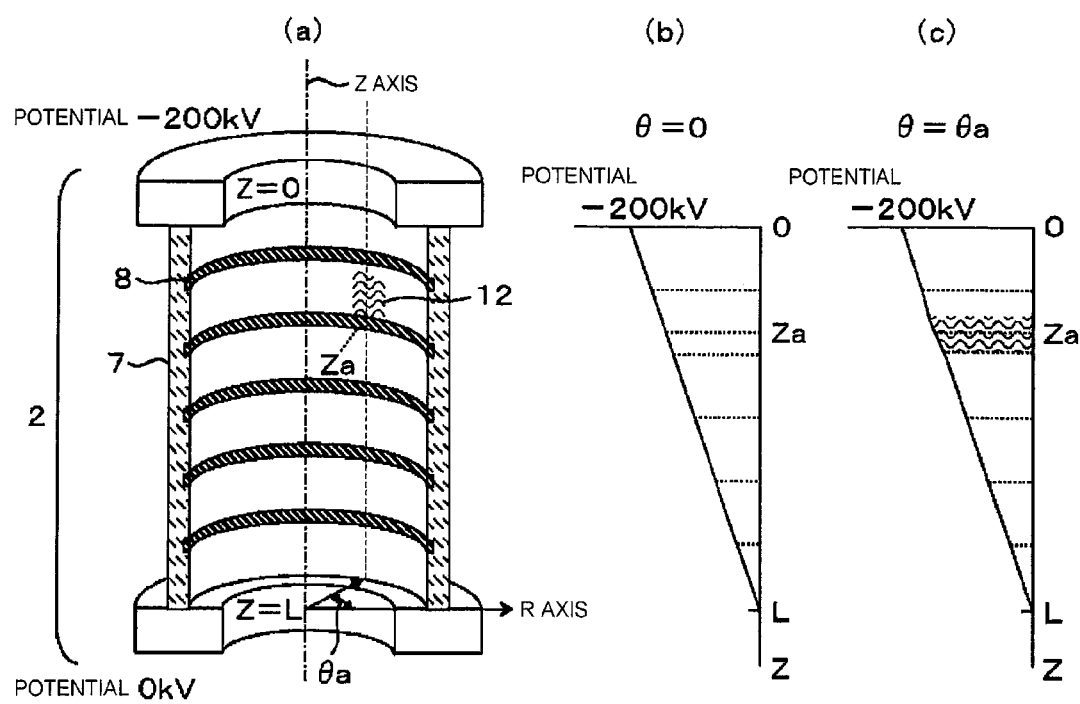
[FIG. 9]
An explanatory view showing the principle of overcoming a drawback by using the electron gun of the present invention which uses the conductive insulator.

Next, the explanation is made with respect to the manner of operation and advantageous effects of the accelerating tube of this embodiment when a region having different resistance is present on specific portions of the conductive insulator. FIG. 9($a$) is a schematic view of the accelerating tube when a region whose resistance differs from the resistance of an area around the region is formed on specific portions of an inner wall surface of the conductive insulator in the same manner as the accelerating tube shown in FIG. 6($a$). Assume a circular columnar coordinate system in the inside of the accelerating tube in the same manner as FIG. 6($a$). It is also assumed that the resistance of a region 12 of the inner wall surface of the accelerating tube in the vicinity of a position at a height ($Z=Za$) and at an angle ($\theta=\theta a$) is larger than the resistances of other portions. It is also assumed that a potential of an upper portion ($Z=0$) of the accelerating tube is −200 kV, and a potential of a lower portion ($Z=L$) of the accelerating tube is 0V. FIG. 9($b$) shows the potential distribution in the Z direction on an R axis ($\theta=0$), and FIG. 9($c$) shows the potential distribution on a Z axis at a position ($\theta=\theta a$) in the circumferential direction where the region 12 is present. The circular columnar conductive insulator 7 has the same manner of operation as the bleeder resistance shown in FIG. 2 due to the resistance which the conductive insulator per se has, and the potential distribution having the substantially uniform potential gradient is formed in the longitudinal direction of the accelerating tube. Accordingly, the potential gradient at the position ($\theta=0$) in the circumferential direction becomes fixed as shown in FIG. 9($b$). On the other hand, the potential gradient at the position $\theta=\theta a$ in the circumferential direction becomes large in the region 12 as shown in FIG. 9($c$).

However, in the accelerating tube of this embodiment shown in FIG. 9($a$), four metal-metalized regions 8 are formed on the inner wall surface. Since the potential of the metal-metalized regions 8 is fixed, equipotential lines which extend along the metal-metalized regions 8 are formed in the accelerating tube. The disturbance of the potential gradient induced by the region 12 is rectified by the equipotential lines formed by the metal-metalized regions 8. Accordingly, even when the resistance of one portion 12 on the inner surface of the accelerating tube becomes large, a change in potential gradient in the longitudinal direction of the accelerating tube can be suppressed to a small value. Further, the electric field distribution becomes substantially flat within a plane surrounded by the equipotential lines (a cross section obtained by cutting the accelerating tube 2 with the equipotential line) and hence, a force in the lateral direction does not act on an electron beam which passes along a center axis. That is, the potential gradient within a plane surrounded by the metal-metalized regions 8 can be maintained at an approximately fixed level and hence, the aberration can be made small.

Figure 8:
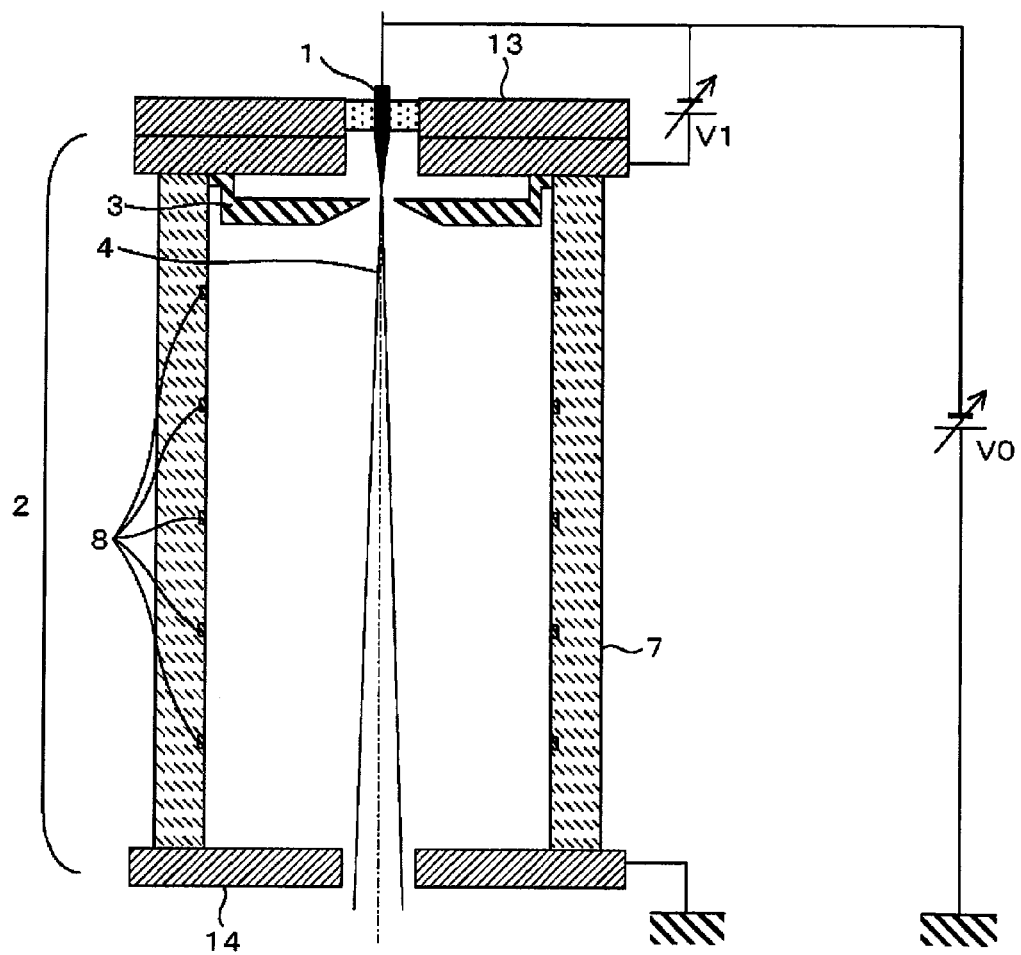
[FIG. 8]
An explanatory view showing another embodiment of the electron gun of the present invention which uses a conductive insulator (embodiment 2).

FIG. 8 shows a modification of the electron gun shown in FIG. 1. An electron gun shown in FIG. 8 has the structure where a control electrode 5 is removed so that the whole accelerating tube 2 is formed of a conductive insulator 7. In this case, an electron beam 4 extracted from an FE electron source 1 is accelerated straightly and is discharged from the electron gun and hence, the aberration can be made smaller. Further, it is also possible to eliminate a control power source which supplies a control voltage (V2).

In this embodiment, the description has been made by taking the electron gun having the accelerating tube structure with an accelerating voltage of 100 kV to 300 kV as a representing example. However, the accelerating voltage is not limited to a value which falls within such a range. Further, the present invention is not limited to only the electron gun explained in conjunction with this embodiment, and the present invention is also applicable to other charged particle beam discharging apparatuses such as an ion gun, for example.

REFERENCE SIGNS LIST

1: FE electron source
2: accelerating tube
3: extracting electrode
4: electron beam
5: control electrode
6: insulating-material insulator
7: conductive insulator
8: metal-metalized region
9: conductor metal
10: accelerating electrode
11: bleeder resistor
12: region with large resistance
13, 14: metal member

The invention claimed is:

1. An electron gun comprising:
an electron source provided with a chip portion which discharges an electron beam;
a ground electrode which is arranged below the electron source;
a circular columnar conductive insulator which is fixed to the ground electrode and is arranged such that the conductive insulator surrounds a trajectory of the electron beam;
an extracting electrode which is arranged in the inside of the circular columnar conductive insulator, and to which an extracting voltage for extracting the electron beam from the electron source is applied; and
a conductive member which is arranged above the conductive insulator for applying the extracting voltage to the extracting electrode, wherein
a metalized region is formed on an inner wall surface of the circular columnar conductive insulator.

2. The electron gun according to claim 1, further comprising:
a circular columnar insulating insulator which is arranged between the conductive member and the circular columnar conductive insulator such that the insulating insulator surrounds the trajectory of the electron beam; and
a control electrode which is arranged in a space formed by the circular columnar insulating insulator and the circular columnar conductive insulator and below the extracting electrode.

3. The electron gun according to claim 1, wherein the metalized region is formed of a plurality of grooves formed on the inner wall surface of the circular columnar conductive insulator.

4. The electron gun according to claim 2, wherein the metalized region is formed of a plurality of grooves formed on the inner wall surface of the circular columnar conductive insulator.

* * * * *